(12) United States Patent
Hendrickson et al.

(10) Patent No.: US 7,413,849 B2
(45) Date of Patent: Aug. 19, 2008

(54) SUBSTITUTED BENZENE DEVELOPING SOLVENT FOR PHOTOPOLYMERIZABLE PRINTING PLATES

(75) Inventors: Constance Marie Hendrickson, Irving, TX (US); David Calvin Bradford, Winston Salem, NC (US)

(73) Assignee: Nupro Technologies, Winston-Salem, NC (US)

( * ) Notice: Subject to any disclaimer, the term of this patent is extended or adjusted under 35 U.S.C. 154(b) by 0 days.

(21) Appl. No.: 10/937,386

(22) Filed: Sep. 10, 2004

(65) Prior Publication Data

US 2006/0057498 A1 Mar. 16, 2006

(51) Int. Cl.
*G03F 7/30* (2006.01)
*G03F 7/32* (2006.01)

(52) U.S. Cl. ...................... 430/331; 430/306
(58) Field of Classification Search ................ 430/306, 430/331
See application file for complete search history.

(56) References Cited

U.S. PATENT DOCUMENTS

| 3,090,774 | A | 5/1963 | Scoggin |
| 4,271,261 | A | 6/1981 | Shimizu et al. |
| 4,847,182 | A | 7/1989 | Worns et al. |
| 4,992,108 | A | 2/1991 | Ward et al. |
| 5,176,986 | A | 1/1993 | Telser et al. |
| 5,312,719 | A | 5/1994 | Schlosser et al. |
| 5,578,420 | A | 11/1996 | Takagi et al. |
| 5,728,664 | A | 3/1998 | Michelotti |
| 6,162,593 | A | 12/2000 | Wyatt et al. |
| 6,248,502 | B1 | 6/2001 | Eklund |
| 2003/0104315 | A1* | 6/2003 | Hendrickson et al. ....... 430/294 |
| 2003/0211429 | A1 | 11/2003 | Fiebag et al. |

OTHER PUBLICATIONS

Abstract of JP403006560A.*
*Takeda Chemical Industries, Ltd.* . . . v. *Alphapharm Pty, Ltd.* . . . Jun. 28, 2007.*

* cited by examiner

*Primary Examiner*—Hoa V Le
(74) *Attorney, Agent, or Firm*—Blank Rome LLP

(57) ABSTRACT

Flexographic printing plates are produced by exposing the photopolymer plates to a light source and washing out (developing) the masked out, non-exposed areas with a solvent. The invention provides substituted benzene solvents suitable for use in the development of photopolymer printing plates. The solvents, which include substituted benzene alone or mixed with co-solvents and/or non-solvents, are effective in developing a large number of different photopolymer printing plates and can produce images superior to those obtained with commercially available solvents currently used in such applications.

36 Claims, 3 Drawing Sheets

CLOSED POSITION   OPEN POSITION

"DESLUDGER" SOLID BOWL DISC CENTRIFUGE

SUBSTITUTED BENZENE DEVELOPING SOLVENT FOR PHOTOPOLYMERIZABLE PRINTING PLATES

FIELD OF THE INVENTION

The present invention relates to an improved solvent and process for the production of flexographic printing plates crosslinked by photopolymerization. More specifically, the invention relates to a solvent system using substituted benzene, alone or in combination with co-solvents and/or non-solvents, as washout solvents for the unpolymerized material in the printing plates to develop a relief image and methods for developing printing plates.

BACKGROUND OF THE INVENTION

Washout processes for the development of photopolymerizable flexographic printing plates are well known and is described in detail in U.S. Pat. No. 5,240,815 which is incorporated herein by reference. Ordinarily, exposed plates are washed (developed) in a developing solvent that can remove the unpolymerized material while leaving the polymerized (cured) material intact. The solvent typically used in such processes include: (a) chlorohydrocarbons, such as trichloroethylene, perchloroethylene or trichloroethane, alone or in a mixture with a lower alcohol, such as n-butanol; (b) saturated cyclic or acyclic hydrocarbons, such as petroleum ether, hexane, heptane, octane, cyclohexane or methylcyclohexane; (c) aromatic hydrocarbons, such as benzene, toluene or xylene; (d) lower aliphatic ketones, such as acetone, methyl ethyl ketone or methyl isobutyl ketone; and (e) terpene hydrocarbons, such as d-limonene.

One important disadvantage of the known solvents and the procedures for their use is that the solvents being used as developers may act too slowly, cause swelling of the plates and/or cause damage to the fine detail in the plate by undercutting and/or pinholing. Moreover, when non-chlorinated solvents are used in the washout process, long drying times may be necessary. Furthermore, many of these solvents have flashpoints of less than 100° F., so that the process can only be operated in special, explosion-protected plants. Many of the prior art solvents are considered Hazardous Air Pollutants (HAPS), and are subject to stringent reporting requirements. When chlorohydrocarbons and other toxic chemicals are used, their toxicity also gives rise to disposal problems and worker safety issues.

An essential step to any photopolymerizable relief printing process is the development of the printing plate after the image is formed through imagewise exposure of the photopolymerizable plate to light. The image is formed by polymerizing and crosslinking of the photopolimerizable material that is exposed while the unexposed portion remains unpolymerized. Ordinarily, development is accomplished by washing the exposed plate in a solvent which can remove the unpolymerized material while leaving the polymerized (cured) material intact. Since such plates can be formed from a variety of materials, it is necessary to match a specific plate with an appropriate solvent. For example, U.S. Pat. Nos. 4,323,636, 4,323,637, 4,423,135, and 4,369,246, the disclosures of which are incorporated herein by reference, disclose a variety of photopolymer printing plate compositions based on block copolymers of styrene and butadiene (SBS) or isoprene (SIS). These compositions can be utilized to produce printing plates which can be developed by a number of aliphatic and aromatic solvents, including methyl ethyl ketone, toluene, xylene, d-limonene, carbon tetrachloride, trichloroethane, methyl chloroform, and tetrachloroethylene. These solvents may be used alone or in a mixture with a "non-solvent" (i.e. a substance that cannot dissolve unpolymerized materials), for example, trichloroethane with ethanol. In any case, during the development step, the solvent can be applied in any convenient manner such as by pouring, immersing, spraying, or roller application. Brushing, which aids in the removal of the unpolymerized or uncrosslinked portions of the composition, can also be performed to facilitate the processing of the plate.

Similarly, UK 1,358,062, the disclosure of which are incorporated herein by reference, discloses photosensitive compositions consisting of a nitrile rubber with an addition of photopolymerizable tri- or tetra-unsaturated ester derived from acrylic or methacrylic acid combined with an addition polymerization initiator activated by actinic radiation. Plates made from this composition can be developed by organic solvents including aliphatic esters such as ethyl acetate, aliphatic ketones such as acetone, methyl ethyl ketone, d-limonene, halogenated organic solvents, such as chloroform, methylene chloride, CFC 113 or blends of such solvents. Brushing or agitation can be used to facilitate the removal of the non-polymerized portion of the composition.

U.S. Pat. No. 4,177,074, the disclosure of which are incorporated herein by reference, discloses a photosensitive composition containing a high molecular weight butadiene/acrylonitrile copolymer which contains carboxyl groups, a low molecular weight butadiene polymer which may or may not contain carboxyl groups, and an ethylenically unsaturated monomer, combined with a free-radical generating system. This composition is also used as the polymer layer of a flexographic printing plate and requires processing with such organic solvents as methyl ethyl ketone, benzene, toluene, xylene, d-limonene, trichloroethane, trichlorethylene, methyl chloroform, tetrachloroethylene, or solvent/non-solvent mixtures, e.g., tetrachloroethylene and n-butanol. The composition may also be processed with water-soluble organic solvents in an aqueous basic solution, such as sodium hydroxide/isopropyl alcohol/water; sodium carbonate/isopropyl alcohol/water; sodium carbonate/2-butoxyethanol/water; sodium borate/2-butoxyethanol/water; sodium silicate/2-butoxyethanol/water; sodium borate/2-butoxyethanol/water; sodium silicate/2-butoxyethanol/glycerol/water; and sodium carbonate/2-(2-butoxyethoxy)ethanol/water.

U.S. Pat. No. 4,517,279, the disclosure of which is incorporated herein by reference, discloses a photosensitive composition containing a high molecular weight butadiene acrylonitrile copolymer which contains carboxyl groups, and a high molecular weight butadiene/acrylonitrile copolymer which does not contain carboxyl groups, combined with ethylenically unsaturated monomer and a free radical generating system. That composition, which is also used as the polymer layer of a flexographic printing plate, requires processing by blends of tetrachloroethylene and a non-solvent. The composition may also be processed in mixtures of sodium hydroxide/isopropyl alcohol/water; sodium carbonate/2-butoxyethanol/water; sodium silicate/2-butoxyethanol/water; sodium carbonate/2-butoxyethanol/glycerol/water; and sodium hydroxide/2-(2-butoxyethoxy)ethanol/water.

As can be seen from the foregoing examples of the prior art, the solvents needed for image development will vary depending on the composition of the polymer layer of the plate. The need for different solvent systems is particularly inconvenient, especially if different photopolymer systems are being processed at the same facility. Furthermore, many of the solvents used to develop the plates are toxic or suspected carcinogens. Thus, there exists a real need for solvent systems which can be used with a greater degree of safety. In addition, there exists a need for solvent systems which can be used in a variety of plates. U.S. Pat. Nos. 4,806,452 and 4,847,182, the disclosures of which are incorporated herein by reference, disclose solvent developers for flexographic plates containing terpene hydrocarbons such as d-limonene which are effective on a variety of plate types. These terpene hydrocarbon-based developers are also non-toxic. However, they have proven to be hazards in the workplace because of their tendency to spontaneously combust thereby causing fires. The terpene hydrocarbons also have low flash points compared to the terpene ethers, e.g., the flash point of d-limonene (tag closed cup method (TCC)) is 120° F., whereas the flash point of terpinyl alkyl ether (TCC) is >200° F. which increases the safety of the terpene ethers.

Therefore, commonly assigned U.S. Pat. Nos. 6,248,502 and 6,582,886, the disclosures of which are incorporated herein by reference, solve the drawbacks of terpene by using terpene esters and methyl esters as substitute developing solvents. Because terpene ester has a higher flash point, the fire risk is greatly decreased. However, terpene esters tends to breakdown through repeated distillation which limits the recyclability of the solvent.

Another drawback of the prior art developing solvent is the lack of an inexpensive method to reclaim the solvent for subsequent use. Reclamation and recycling of current solvents generally require distillation which is energy and labor intensive.

The present invention relates to a developing solvent that offers significant improvement over the prior art. The present invention offers an environmentally friendly, low odor developing solvent that can simply be reclaimed and separated from the polymer inexpensively through centrifugation.

SUMMARY OF THE INVENTION

The present invention relates to solvents for use in the processing of a wide variety of photopolymeric materials used to form photopolymer printing plates. These solvents, which comprise substituted benzenes either alone or in the presence of other organic materials (co-solvents and non-solvents). The preferred substituted benzenes for the present invention are tert-butyl substituted benzenes and di-butyl benzenes.

The developing solvent can be used with a variety of polymeric systems, including, but is not limited to SBS and SIS polymer systems, as well as a large number of nitrile rubber and other copolymer systems. The tert-butyl substituted benzenes are natural products with low toxicity, low odor, and are relatively safe to use compared with other solvent systems. The present inventors has discovered that the substituted benzenes of the present invention provide a unique combination of reduced cost, improved plate quality, low volatility, improved regulatory compliance, low toxicity, low odor, and reduced washout time.

It is, therefore, an object of the present invention to provide a solvent system and a process for the preparation of relief plates crosslinked by photopolymerization, in which the washout time and the drying time are substantially shorter compared with the conventional process solvents, and wherein the relief plates suffer neither excessive surface swelling nor under-washing and are characterized by improved relief depths and sidewall structure.

Another object of the present invention is to provide a process for the preparation of relief plates crosslinked by photopolymerization which is capable of operation without expensive explosion protection.

It is another object of the present invention to provide solvent systems for use with photopolymeric printing plates which overcome the spontaneous combustion problems of the prior art solvent systems.

It is another object of the present invention is to provide solvent systems which minimizes workplace hazards and requires minimal regulatory reporting.

It is another object of the present invention to provide methods of reclaiming and recycling the polymer-contaminated solvent that was used in the developing process for the preparation of relief plates crosslinked by photopolymerization. The reclaiming process can be continuous or batch. The process comprises transferring the contaminated solvent, from a plate processor or a dirty holding tank, to a centrifuge, and centrifuging the contaminated solvent to remove the polymer. The reclaimed solvent can be transfer directly back to the plate processor or to a clean holding tank.

DETAILED DESCRIPTION OF THE INVENTION

Figure 1:
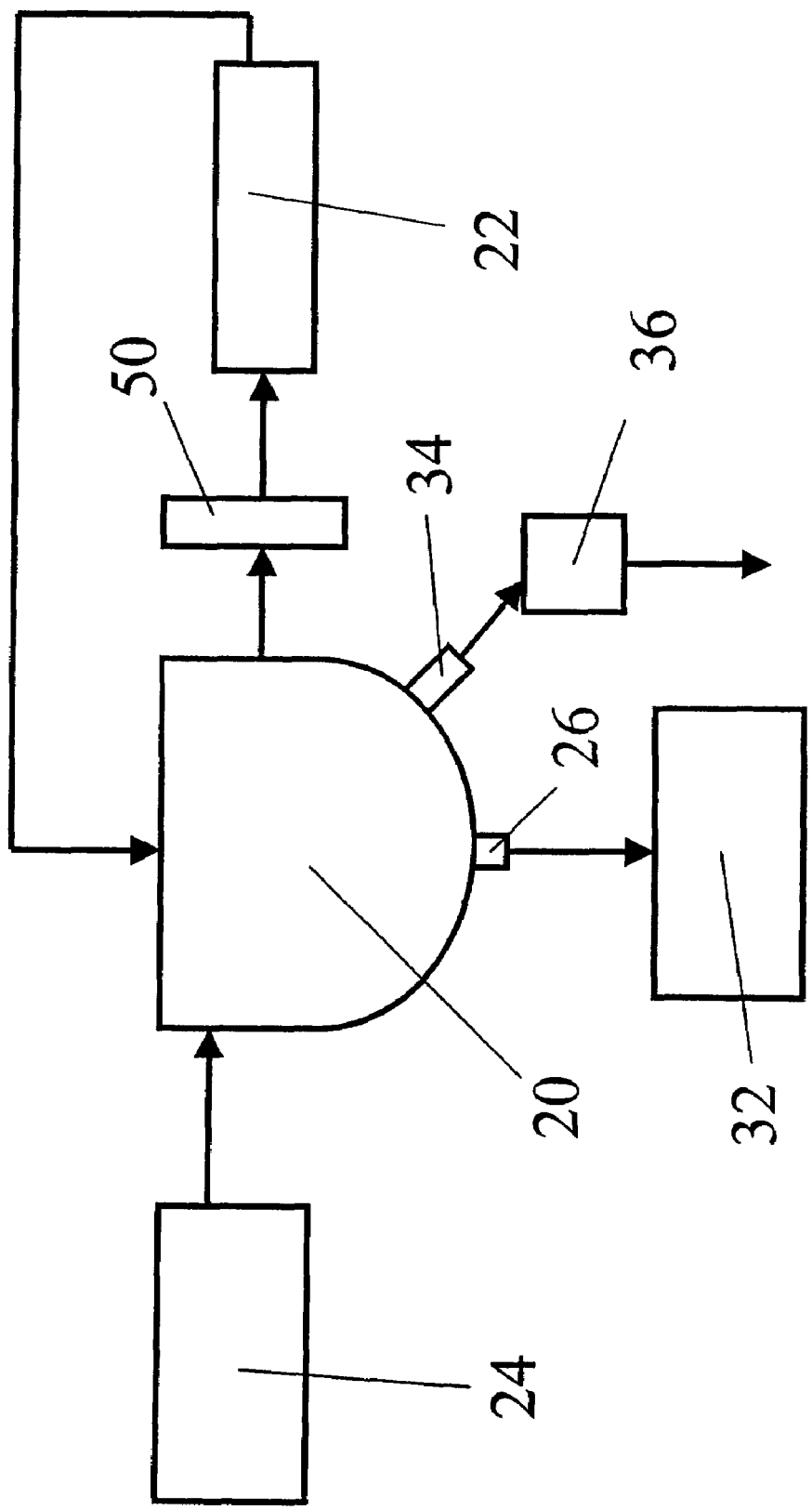
FIG. 1 shows the reclamation process with a single plate processor.

The present invention comprises substituted benzene solvents for use in photopolymer printing plate processing. In one embodiment, the substituted benzenes are tert-butyl substituted benzenes having the chemical formula (I)

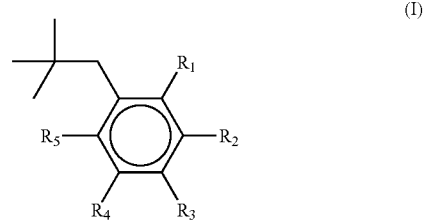

where $R_1$-$R_5$ are the same or different, and denotes a hydrogen, hydroxyl, alkyl, alkenyl, aryl, amine/amide, ester, carboxylic acid, and aldehyde. The preferred tert-butyl substituted benzenes are tert-butyl benzene, tert-butyl xylene, di-tert-butyl benzene, tert-butyl toluene, di-tert-butyl toluene, di-tert-butyl xylene, 1-tert-butyl-3,5-dimethylbenzene, and combinations thereof.

In a second embodiment, the substituted benzenes are di-butyl benzenes. These includes di-sec-butyl benzene, di-n-butyl benzene, wherein the substitution can be in the ortho, para, or meta positions.

The substituted benzene, which can be used either alone or in a blended form with co-solvents or non-solvents, can be used to develop a number of different photopolymer printing plates. As used herein, co-solvents are non-substituted benzene compounds that can also dissolve the non-polymerized material; and non-solvents are compounds that cannot dissolve the non-polymerized material.

Mixtures of substituted benzenes can also be used and may show synergistic effects when compared with a substituted benzene used alone. When a combination of two or more substituted benzenes is used, the resulting blend is often more effective as a solvent than the individual substituted benzenes. This blend is referred to herein as a mixed substituted benzenes (MSB) solvent.

Various co-solvents (non-substituted benzene compounds that can also, by themselves, dissolve the non-polymerized material) and non-solvents (compounds that cannot, by themselves, dissolve the non-polymerized material) can also be employed with the tert-butyl substituted benzenes and MSB according to the invention. Suitable co-solvents include, but is not limited to, terpene ester, alkyl ester, terpene ether, n-butanol, 2-ethoxyethanol, benzyl alcohol, ethanol, methanol, propanol, isopropanol, alpha terpineol, dipropylene glycol methyl ether, 2-butoxyethanol, isopropyl alcohol, and 2-(2-butoxyethoxy) ethanol, cyclopentanol, cyclohexanol, cycloheptanol, substituted cyclopentanol, substituted cyclohexanol, substituted cycloheptanol, cyclopentyl substituted alcohol, cyclohexyl substituted alcohol, and cycloheptyl substituted alcohol.

The co-solvent should be soluble in the substituted benzenes and MSB, should have suitable dissolving properties towards the non-photolysed (non-polymerized) portions of the plate that are to be dissolved, should have low toxicity and acceptable safety profiles, and should be readily disposable. The co-solvents are used to modify the properties of the solvent blend. This includes, for example, the addition of co-solvents to aid in the removal of the top protective cover skin on the flexographic plate. In addition, several of the co-solvents, such as terpene alcohols, in particular alpha terpineol, serve as stabilizers to prevent the separation of the solvent blend, which can occur at reduced temperatures. This stabilizer property of the co-solvent becomes important when isoparaffinic hydrocarbons are used as the non-solvent and benzyl alcohol is used as a co-solvent to remove the outer layer of the photopolymerizable printing plate because the benzyl alcohol may separate from the substituted benzenes and paraffinic hydrocarbon mixture. Further, the mixture of substituted benzenes and co-solvent may be more effective as a solvent than the individual substituted benzenes by itself.

The non-solvent should be miscible with the substituted benzenes, or substituted benzenes and the co-solvents, should have acceptable toxicity and safety profiles, and should be readily disposable or recyclable. The non-solvent are typically used as a filler to reduce cost, therefore, recyclability of the non-solvent material is highly desirable. Suitable non-solvents include, but is not limited to, petroleum distillates, such as aliphatic petroleum distillates, naphthas, paraffinic solvents, hydrotreated petroleum distillates, mineral oil, mineral spirits, ligroin, decane, octane, hexane and other similar materials. Isoparaffinic solvents are commercially available in a wide range of volatility and corresponding flash points. The developing solvent of the invention can made with a wide range of commercially available isoparaffinic solvents as its non-solvent base. The following table shows volatilities and properties of commercially available isoparaffinic solvents suitable for use with the invention.

TABLE 1

| | Volatility | | | | |
|---|---|---|---|---|---|
| Flash Point (°F.) | 106 | 129 | 135 | 147 | 196 |
| Initial Boiling Point (°F.) | 320 | 352 | 350 | 376 | 433 |
| 50% Dry Point (°F.) | 331 | 360 | 365 | 383 | 460 |
| | 345 | 370 | 386 | 405 | 487 |
| Vapor Pressure (mm Hg @ 100 °F.) | 14 | 6.2 | 5.7 | 5.2 | 3.1 |

Parameters such as drying rates, fire risk, workplace air quality and volatile organic compound emissions will also play a role in the selected non-solvent choice. The developing solvent components can be varied but a suitable composition would be about 40-70% by volume of at least one substituted benzene, about 10-50% by volume of at least one co-solvent capable of dissolving the top protective cover layer of the flexographic plate, and about 10-40% by volume of a non-solvent. Preferred compositions includes:

1) 50% dibutylbenzene, 35% isoparaffins, and 15% benzyl alcohol;

2) 60% 1, 3, di-tert-butylbenzene, 20% isoparaffins, and 20% benzyl alcohol;

3) 40% tert-butyltoluenes (mixed), 40% isoparaffins, and 20% mixed 8-10 alcohols;

6) 50% tert-butylbenzene, 35% isoparaffins, and 15% mixed 8-10 alcohols; and 7) 50% tert-butylxylenes (mixed), 35% isoparaffins, and 15% benzyl alcohol.

The substituted benzene-based solvents may be substituted for the synthetic hydrocarbon, oxygenated solvents or halogenated hydrocarbon solvents used for processing photopolymer printing plates. For example, the substituted benzene solvents are suitable in the processing of photopolymer printing plates based on block copolymers of styrene and butadiene (SBS) or styrene and isoprene (SIS), copolymers of butadiene and acrylonitrile, terpolymers of butadiene, acrylonitrile and acrylic acid and other similar photopolymers. The substituted benzene-based solvents can be applied to the plates by any conventional application means including spraying, brushing, rolling, dipping (immersing) or any combination thereof. The substituted benzene solvents also produce photopolymer plates with less cured polymer image swelling than those processed in conventional hydrocarbon or chlorinated hydrocarbon solvents. Since swelling tends to distort the image formed, this surprising result permits clear, sharp images to be formed at much lower exposure times than those resulting from the use of conventional solvents. Additionally, the solvents of the invention have fairly low volatility and odor which reduces worker exposure during plate processing. Furthermore, because substituted benzenes of the present invention are natural products, they are much less toxic and are more readily biodegradable than synthetic hydrocarbon or chlorinated hydrocarbon solvents.

After utilization as a developing solvent, the substituted benzene-based solvent is contaminated with polymers released from the printing plate. Because the solvent is relatively expensive, it is desirous to be able to recycle the solvent for subsequent developing processes. Applicant has discovered that the present substituted benzene-based solvent can be separated from the polymer contaminate simply through centrifugation. The reclaimed solvent has a purity of about 99.5%.

Figure 2:
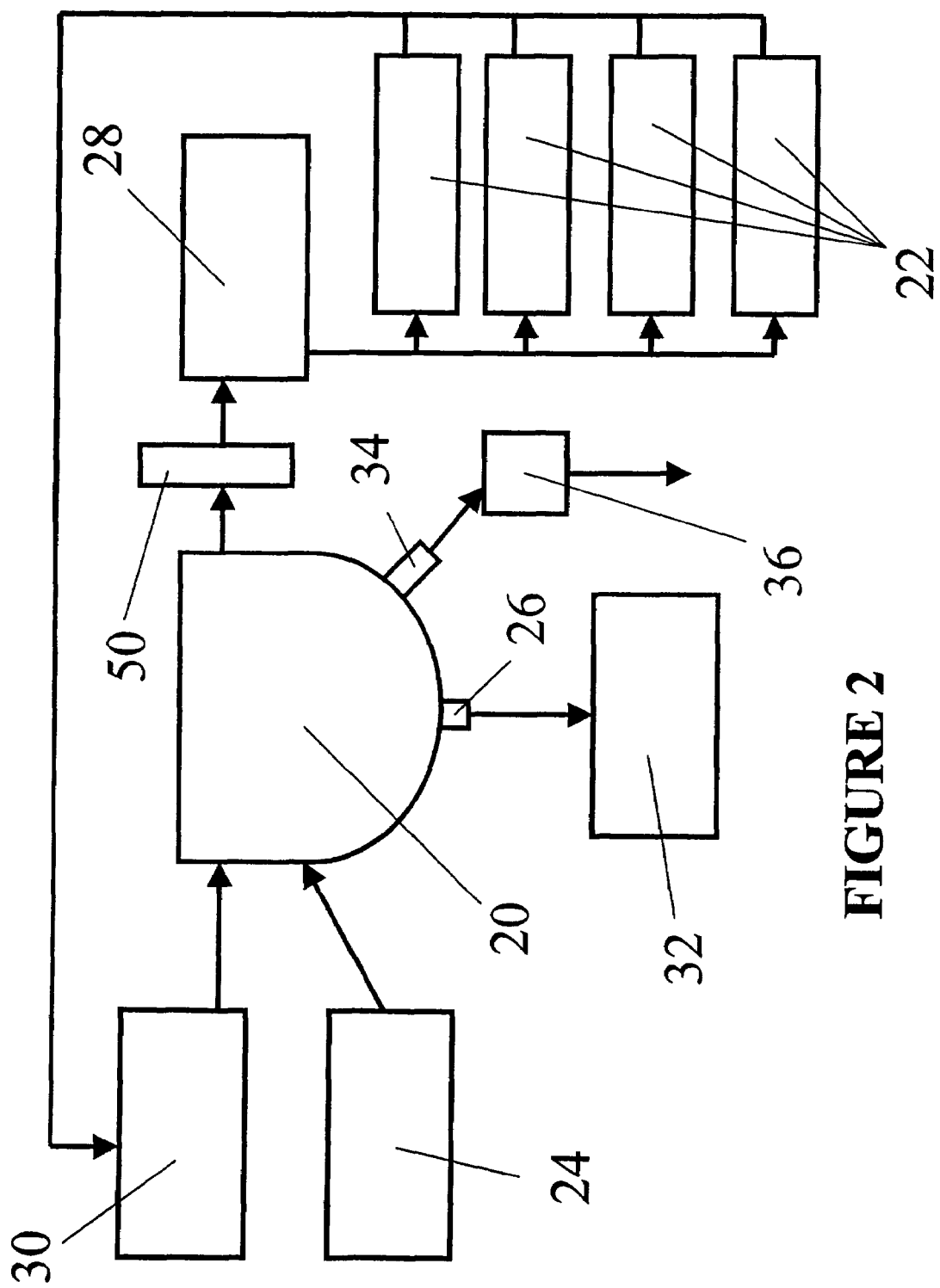
FIG. 2 shows the reclamation process with multiple plates processor.

The reclamation process is described in FIGS. 1 and 2. FIG. 1 discloses the reclamation process with a single plate processor set up. The polymer-contaminated solvent from the plate processor 22 is fed into the centrifuge 20, preferably through a conduit. Typically, the polymer-contaminated solvent contains about 3% to about 10% polymer, most preferably about 6% polymer. Because the process yield is generally less than 100%, fresh solvent is also fed into the centrifuge from a replenishment drum 24.

Figure 3:
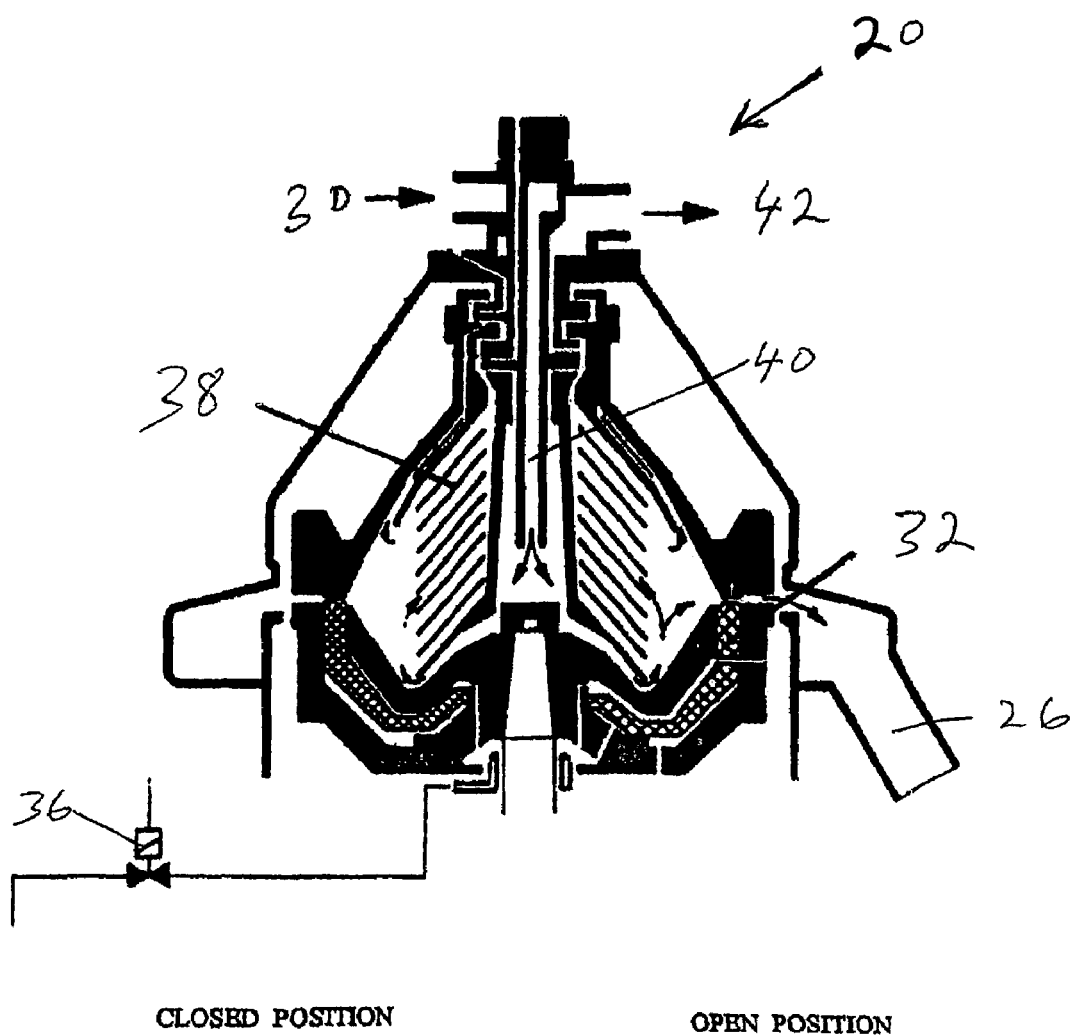
FIG. 3 shows a bowl disc centrifuge.

The centrifuged 20 used is preferably, but not limited to, a bowl disc centrifuge shown in FIG. 3. Polymer-contaminated solvent to be purified is fed to the feed port 30 of the centrifuge, from which it flows down the central feed tube 40 and out into the bowl at the bottom of the disc stack 38. While contaminated solvent is fed to the centrifuge at the feed port 30, the moveable piston 32 is in the up or closed position, as controlled by the flow of the centrifuge operating fluid (usually water), which is delivered to the centrifuge by the action of a solenoid valve 36. The solvent flows through the discs 38, which retain polymers more dense than the solvent. The polymer travels to the periphery of the discs and are accelerated to the outermost part of the bowl, where they are collected. The purified solvent transits the disc stack and exits the centrifuge as the clarified product at the exit 42. Periodically, solids are ejected from the centrifuge bowl by briefly opening the moveable piston 32 by means of the operating fluid. The polymer waste stream is ejected from the bowl through the waste port 26. Typically, the centrifuge bowl is open for about 3 second at a time for ejecting the polymer waste from the bowl. During each opening, about 0.017 pounds of solvent is lost per square foot of photopolymer plate processed. The waste is held in a waste holding tank 32 to be prepared for disposal. For safety purposes, the centrifuge may have a pressure relief valve 34 attached to an exhaust fan 36 for venting if excessive pressure is present in the system.

The purified solvent can be fed directly to the plate processor 22 as depicted in FIG. 1 or to a clean holding tank 28 to be prepared for subsequent use. In an embodiment of the invention, the polymer-contaminated solvent is transferred from the plate processors to a dirty holding tank 30 before being fed into the centrifuge. Likewise, the purified solvent exiting the centrifuge is transferred to a clean tank before the solvent is distributed to individual plate processor. The process of FIG. 2 is more flexible than that of FIG. 1 because the number of operating plate processor can be varied according to the needs and requirements of the overall developing process.

In a preferred embodiment of the present invention, the purified solvent are directed through a filter 50 prior to being fed into the plate processor 22 or the clean holding tank 28. The filter serves to remove particulate materials in the purified solvent. Preferably the filter can be a polypropylene bag or a cartridge typed filter, preferably polypropylene. The filter pore size is preferably between 1 to about 10 microns. In certain embodiments, a series of filters provides the most efficient operation. In those cases, a gradual step down in pore size from about 10 microns to about 1 micron are preferred.

The centrifuge may be any type of centrifuge, preferably a disc centrifuge provided with conical discs and able to centrifuge liquids at high g forces as described above. Depending on the characteristics and throughput of the solvent being processed and the size of the centrifuge bowl, the desludger centrifuge rotational speed should be adjusted so as to provide a centrifugal force of at least about 4,000 g, and preferably between about 4,000 g and 12,000 g. Since the g force is a function of the rotational speed and the radius of the centrifuge bowl, the optimum process g force is limited only by the size of the equipment used and the strength of the stainless steel or other alloy used in the fabrication of the equipment.

The solvent is preferably maintained at room temperature throughout the process. Most preferably, the solvent is maintained at about 70° F. This can be accomplished through cooling and/or heating of the solvent in the piping system and/or the centrifuge. On the other hand, depending on the particular solvent composition, no heating and/or cooling is required as room temperature is sufficient to maintain the solvent temperature in the operating range.

EXAMPLE

The drying times of the following flexo plate washout formulations were compared in a commercial, high volume, platemaking facility:

| Component | Formulation 1 Weight Percent | Formulation 2 Weight Percent |
|---|---|---|
| 1-tert-butyl-3,5-dimethylbenzene | 40 | 30 |
| Isopar L (isoparaffinic hydrocarbon) | 40 | 50 |
| Benzyl alcohol | 20 | 20 |

| Formulation 1 | | Formulation 2 | |
|---|---|---|---|
| Component | Weight Percent | Component | Weight Percent |
| Mixed Terpene Esters* | 13.3% | Mixed Terpene Esters* | 15.4% |
| Hydrotreated hydrocarbons** | 69.0% | Isoparaffinic hydrocarbons** | 72.5% |
| Benzyl Alcohol*** | 15.4% | Benzyl Alcohol*** | 12.8% |
| Alpha Terpenol**** | 2.3% | Alpha Terpenol**** | 2.3% |

*The mixed terpene ester is the mixture of terpinyl alkyl esters (50% by weight), fenchyl alkyl esters (30% by weight) and linalyl alkyl esters (20% by weight). The mixed terpene ether is the mixture of terpinyl alkyl ethers (50% by weight), fenchyl alkyl ethers (30% by weight) and linalyl alkyl ethers (20% by weight).
**The hydrotreated hydrocarbon is Shell 142 HT and the isoparaffinic hydrocarbon is Exxon Isopar L.
***The benzyl alcohol is Bayer photograde.
****The alpha terpinol acts as a co-solvent to keep the components from separating.

| | | | Formulation | | |
|---|---|---|---|---|---|
| Plate Mfg. | Style | Gauge | 1 Washout time | 2 Washout time | 3 and 4 Washout time |
| DuPont | PLS | 0.067 | 425 | 440 | 475 |
| DuPont | PLS | 0.067 | 425 | 440 | — |
| DuPont | PLS | 0.067 | 425 | 440 | — |
| DuPont | TDR | 0.250 | 1000 | 1050 | 1000 |
| DuPont | DPS | 0.045 | 425 | 440 | 425 |
| DuPont | DPS | 0.045 | 425 | 440 | 425 |
| Dupont | DPS | 0.067 | 475 | 490 | 475 |
| Polyfibron | EPIC | 0.107 | 500 | 515 | 525 |
| Polyfibron | EPIC | 0.107 | 500 | 515 | 525 |
| Polyfibron | EPIC | 0.107 | 500 | 515 | 625 |
| Polyfibron | EPIC | 0.107 | 500 | 515 | 525 |
| Polyfibron | EPIC | 0.107 | 500 | 515 | 525 |
| Polyfibron | EPIC | 0.107 | 500 | 515 | 525 |

Numerous plates of manufacturers brand and style were run in a second high volume plate making facility to compare the drying time of Formula 2 using an isoparaffinic nonsolvent versus Formula 1 using an aliphatic distillate as the non-solvent in the washout solution of the invention.

In the second high volume platemaking test facility, the criterion for a dry plate was when the print height of the plate had returned to within 0.0005 inches of its original gauge or thickness. In many cases it was found that the original nonprocessed plate material had variances at least this large. It became apparent that all plates should be inspected prior to developing for initial gauge of the material before processing to be able to use this tight drying gauge tolerance at this facility.

| Plate Mfg. | Style | Gauge | Formulation | | | |
|---|---|---|---|---|---|---|
| | | | 1 Drying Time | 2 Drying Time | 3 Drying Time | 4 Drying Time |
| DuPont | PLS | .067 | 60 | 50 | 240 | 80 |
| DuPont | PLS | .067 | 60 | 50 | 240 | 110 |
| DuPont | PLS | .067 | 60 | 50 | 240 | 95 |
| DuPont | HOS | .107 | 60 | 50 | 270 | 160 |
| DuPont | HOS | .107 | 60 | 50 | 270 | 160 |
| DuPont | TDR | .250 | 105 | 95 | 300 | 165 |
| DuPont | TDR | .250 | 105 | 95 | 300 | 135 |
| DuPont | TDR | .250 | 105 | 95 | 300 | 155 |
| Polyfibron | EPIC | .067 | 60 | 50 | 180 | 90 |
| Polyfibron | EPIC | .067 | 60 | 50 | 180 | 70 |
| Polyfibron | EPIC | .067 | 60 | 50 | 180 | 75 |

Formulations 1 and 2 (with 1-tert-butyl-3,5-dimethylbenzene) as the solvent has substantially similar washout times on most commercially run printing plates when compared to Formulations 3 and 4 (with mixed terpene esters). Importantly, however, the drying times using substitute benzene (Formulations 1 and 2) are significantly shorter when compare with solvents using mixed terpene esters (Formulations 3 and 4). In all cases, the drying times using the substituted benzene solvent are only 21 to 32 percent of the mixed terpene esters solvent. Thus, there is a clear improvement in drying times of the substituted benzene.

The invention has been disclosed broadly and illustrated in reference to representative embodiments described above. Those skilled in the art will recognize that various modifications can be made to the present invention without departing from the spirit and scope thereof.

What is claimed is:

1. A method for the development of photopolymerizable flexographic relief printing plates comprising
   a) selecting a developing solvent, said developing solvent comprising at least one substituted benzene selected from the group consisting of
   i) compound (I)

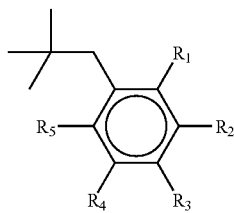

(I)

where $R_1$-$R_5$ are the same or different, and denotes a hydrogen, hydroxyl, alkyl, alkenyl, aryl, amine/amide, ester, carboxylic acid, and aldehyde,
   ii) di-sec-butyl benzene, and
   iii) di-n-butyl benzene; and
   b) washing an exposed flexographic relief printing plate with said developing solvent.

2. The method of claim 1, wherein the compound (I) is selected from the group consisting of tert-butyl benzene, tert-butyl xylene, di-ten-butyl benzene, tert-butyl toluene, di-tert-butyl toluene, di-tent-butyl xylene, 1-tert-butyl-3,5-dimethylbenzene, and combinations thereof.

3. The method of claim 1, wherein the photopolymerizable flexographic relief printing plates is selected from the group consisting of block co-polymers of styrene and butadiene, block co-polymers of styrene and isoprene, co-polymers of butadiene and acrylonitrile, terpolymers of butadiene, acrylonitrile, and acrylic acid.

4. The method of claim 1, wherein the developing solvent further comprising a co-solvent.

5. The method of claim 4, wherein the co-solvent is selected from the group consisting of n-butanol, 2-ethoxyethanol, benzyl alcohol, ethanol, methanol, propanol, isopropanol, alpha terpineol, dipropylene glycol methyl ether, 2-butoxyethanol, isopropyl alcohol, and 2-(2-butoxyethoxy) ethanol, cyclopentanol, cyclohexanol, cycloheptanol, substituted cyclopentanol, substituted cyclohexanol, substituted cycloheptanol, cyclopentyl substituted alcohol, cyclohexyl substituted alcohol, and cycloheptyl substituted alcohol.

6. The method of claim 5, wherein the substituted cyclohexanol is 4-ethycyclohexanol.

7. The method of claim 5, wherein the substituted cyclopentanol is 2,3 dimethylcyclopentanol.

8. The method of claim 5, wherein the cyclohexyl substituted alcohol is cyclohexylpropanol.

9. The method of claim 5, wherein the cyclopentyl substituted alcohol is 4-cyclopentylpentanol.

10. The method of claim 1, wherein the developing solvent further comprising a non-solvent.

11. The method of claim 10, wherein the non-solvent is selected from the group consisting of aliphatic petroleum distillates, naphthas, paraffinic solvents, hydro-treated petroleum distillates, mineral oil, mineral spirits, ligroin, decane, octane, and hexane.

12. The method of claim 11, wherein the paraffinic solvents are isoparafins.

13. The method of claim 1, wherein the developing solvent further comprising a co- solvent and a non-solvent.

14. The method of claim 1, wherein the co-solvent is selected from the group consisting of n-butanol, 2-ethoxyethanol, benzyl alcohol, ethanol, methanol, propanol, isopropanol, alpha terpineol, dipropylene glycol methyl ether, 2-butoxyethanol, isopropyl alcohol, and 2-(2-butoxyethoxy) ethanol, cyclopentanol, cyclohexanol, cycloheptanol, substituted cyclopentanol, substituted cyclohexanol, substituted cycloheptanol, cyclopentyl substituted alcohol, cyclohexyl substituted alcohol, and cycloheptyl substituted alcohol.

15. The method of claim 13, wherein the non-solvent is selected from the group consisting of aliphatic petroleum distillates, naphthas, paraffinic solvents, hydro-treated petroleum distillates, mineral oil, mineral spirits, ligroin, decane, octane, and hexane.

16. The method of claim 15 wherein the paraffinic solvents are isoparaffins.

17. The method of claim 13, wherein the substitute benzene is present in an amount of about 40-70% by volume, the co-solvent is present in an amount of about 20-50% by volume, and the non-solvent is present in an amount of about 10-30% by volume.

18. The method of claim 1, further comprising the step of drying the flexographic relief printing plate to remove the developing solvent.

19. A developing solvent for the development of photopolymerizable flexographic relief printing plates comprising at least one substituted benzene selected from the group consisting of a) compound (I)

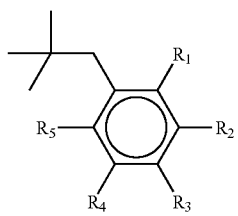

where $R_1$-$R_5$ are the same or different, and denotes a hydrogen, hydroxyl, alkyl, alkenyl, aryl, amine/amide, ester, carboxylic acid, and aldehyde,
  b) di-sec-butyl benzene, and
  c) di-n-butyl benzene.

20. The developing solvent of claim 19, wherein the compound (I) is selected from the group consisting of tert-butyl benzene, tert-butyl xylene, di-tert-butyl benzene, tert-butyl toluene, di-tert-butyl toluene, di-tert-butyl xyiene, 1-tert-butyl-3,5-dimethylbenzene, and combinations thereof.

21. The developing solvent of claim 19, wherein the photopolymerizable flexographic relief printing plates is selected from the group consisting of block co-polymers of styrene and butadiene, block co-polymers of styrene and isoprene, co-polymers of butadiene and acrylonitrile, terpolymers of butadiene, acrylonitrile, and acrylic acid.

22. The developing solvent of claim 19, wherein the developing solvent further comprising a co-solvent.

23. The developing solvent of claim 22, wherein the co-solvent is selected from the group consisting of n-butanol, 2-ethoxyethanol, benzyl alcohol, ethanol, methanol, propanol, isopropanol, alpha terpineol, dipropylene glycol methyl ether, 2-butoxyethanol, isopropyl alcohol, and 2-(2-butoxyethoxy) ethanol, cyclopentanol, cyclohexanol, cycloheptanol, substituted cyclopentanol, substituted cyclohexanol, substituted cycloheptanol, cyclopentyl substituted alcohol, cyclohexyl substituted alcohol, and cycloheptyl substituted alcohol.

24. The developing solvent of claim 23. wherein the substituted cyclohexanol is 4-ethycyclohexanol.

25. The developing solvent of claim 23, wherein the substituted cyclopentanol is 2,3 dimethylcyclopentanol.

26. The developing solvent of claim 23, wherein the cyclohexyl substituted alcohol is cyclohexylpropanol.

27. The developing solvent of claim 23, wherein the cyclopentyl substituted alcohol is 4-cyclopentylpentanol.

28. The developing solvent of claim 19, wherein the developing solvent further comprising a non-solvent.

29. The developing solvent of claim 28, wherein the non-solvent is selected from the group consisting of aliphatic petroleum distillates, naphthas, paraffinic solvents, hydrotreated petroleum distillates, mineral oil, mineral spirits, ligroin, decane, octane, and hexane.

30. The developing solvent of claim 29, wherein the paraffinic solvents are isoparafins.

31. The developing solvent of claim 19, wherein the developing solvent further comprising a co-solvent and a non-solvent.

32. The developing solvent of claim 31, wherein the co-solvent is selected from the group consisting of n-butanol, 2-ethoxyethanol, benzyl alcohol, ethanol, methanol, propanol, isopropanol, alpha terpineol, dipropylene glycol methyl ether, 2-butoxyethanol, isopropyl alcohol, and 2-(2-butoxyethoxy) ethanol, cyclopentanol, cyclohexanol, cycloheptanol, substituted cyclopentanol, substituted cyclohexanol, substituted cycloheptanol, cyclopentyl substituted alcohol, cyclohexyl substituted alcohol, and cycloheptyl substituted alcohol.

33. The developing solvent of claim 31, wherein the non-solvent is selected from the group consisting of aliphatic petroleum distillates, naphthas, paraffinic solvents, hydrotreated petroleum distillates, mineral oil, mineral spirits, ligroin, decane, octane, and hexane.

34. The developing solvent of claim 33, wherein the paraffinic solvents are isoparaffins.

35. The developing solvent of claim 31, wherein the substitute benzene is present in an amount of about 40-70% by volume, the co-solvent is present in an amount of about 20-50% by volume, and the non-solvent is present in an amount of about 10-30% by volume.

36. The method of claim 4, wherein the co-solvent stabilizes the developing solvent.

* * * * *